US007362687B2

(12) United States Patent
Tsukagoshi

(10) Patent No.: US 7,362,687 B2
(45) Date of Patent: Apr. 22, 2008

(54) METHOD AND DEVICE FOR HOLOGRAPHIC RECORDING

(75) Inventor: Takuya Tsukagoshi, Tokyo (JP)

(73) Assignee: TDK Corporation, Tokyo (JP)

( * ) Notice: Subject to any disclaimer, the term of this patent is extended or adjusted under 35 U.S.C. 154(b) by 664 days.

(21) Appl. No.: 10/759,452

(22) Filed: Jan. 16, 2004

(65) Prior Publication Data

US 2004/0145994 A1 Jul. 29, 2004

(30) Foreign Application Priority Data

Jan. 22, 2003 (JP) ............................... 2003-013914

(51) Int. Cl.
*G11B 7/135* (2006.01)
(52) U.S. Cl. .................................. 369/103; 369/112.02
(58) Field of Classification Search ................. 369/100, 369/103
See application file for complete search history.

(56) References Cited

U.S. PATENT DOCUMENTS

| 4,018,503 | A | | 4/1977 | Silverman et al. ............ 350/3.5 |
|---|---|---|---|---|
| 5,319,629 | A | * | 6/1994 | Henshaw et al. ............ 369/103 |
| 5,627,664 | A | * | 5/1997 | Trisnadi ....................... 359/11 |
| 5,719,691 | A | * | 2/1998 | Curtis et al. .................. 359/11 |
| 5,808,998 | A | * | 9/1998 | Curtis et al. ................. 369/103 |
| 5,877,873 | A | * | 3/1999 | Bashaw et al. ................ 359/10 |
| 5,892,601 | A | * | 4/1999 | Curtis et al. .................. 359/22 |
| 5,949,558 | A | * | 9/1999 | Psaltis et al. ................. 359/22 |
| 5,978,112 | A | * | 11/1999 | Psaltis et al. ................. 359/22 |
| 6,614,566 | B1 | * | 9/2003 | Curtis et al. .................. 359/24 |
| 6,697,180 | B1 | * | 2/2004 | Wilson et al. ................ 359/11 |
| 7,092,133 | B2 | * | 8/2006 | Anderson et al. ............. 359/25 |
| 2002/0075776 | A1 | * | 6/2002 | Kasazumi et al. ......... 369/47.5 |

FOREIGN PATENT DOCUMENTS

JP 08-339157 12/1996

* cited by examiner

*Primary Examiner*—Wayne Young
*Assistant Examiner*—Linh T. Nguyen
(74) *Attorney, Agent, or Firm*—Seed IP Law Group PLLC

(57) ABSTRACT

A holographic recording method for recording information as phase information of light by projecting a signal beam and a reference beam onto a recording medium, wherein an X direction is defined as the direction of a line of intersection between a plane including the optical axes of the signal beam and reference beam (incidence plane) and the recording plane of the recording medium, and the Y direction is defined as the direction of a line lying normal to the incidence plane and intersecting said line of intersection, comprises steps of using the reference beam modulated with a first phase code to record a first hologram at a predetermined position and using the reference beam modulated with a second phase code whose pattern is different from that of the first phase code to record at a position shifted in the Y direction a second hologram that partially overlaps the first hologram.

12 Claims, 11 Drawing Sheets

FIG.2
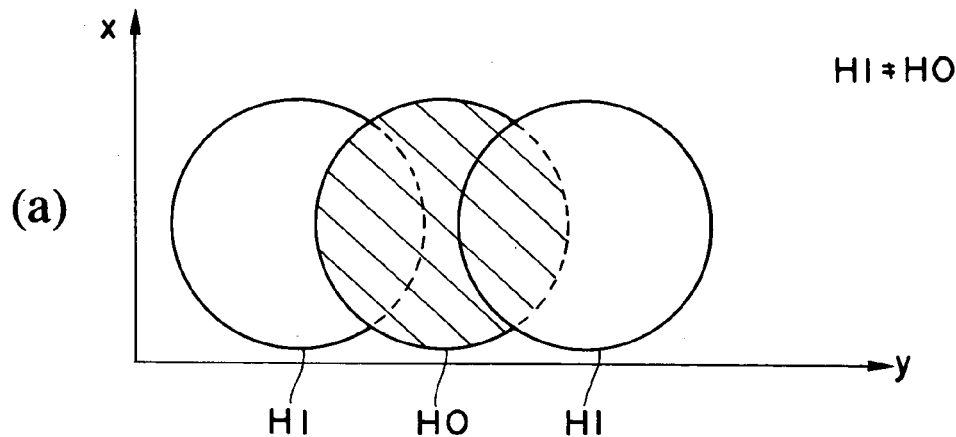
(a) H1≠H0
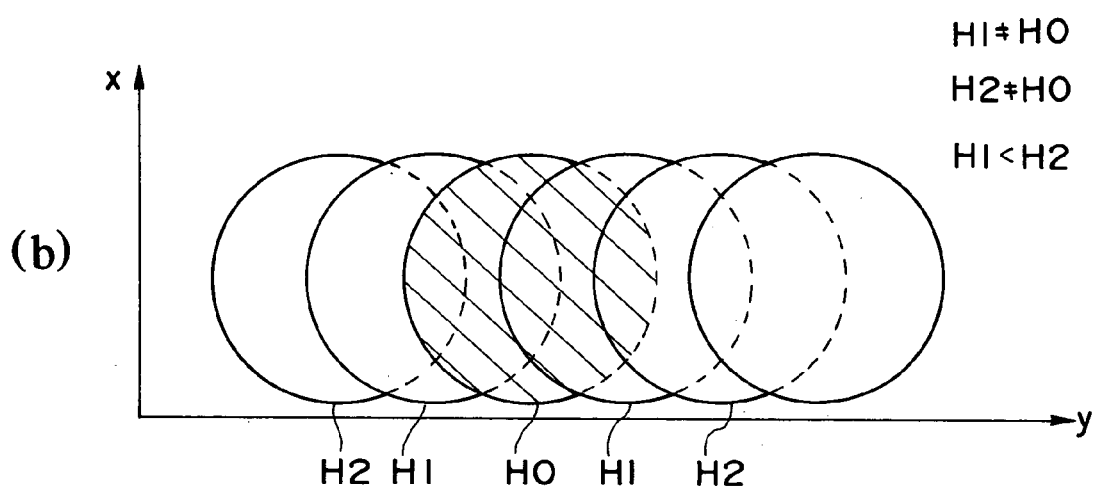
(b) H1≠H0, H2≠H0, H1<H2
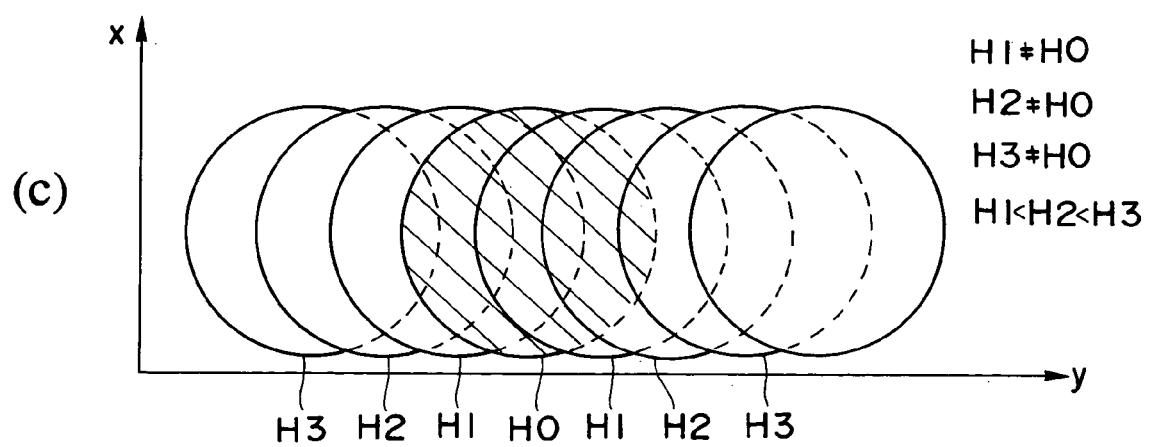
(c) H1≠H0, H2≠H0, H3≠H0, H1<H2<H3

METHOD AND DEVICE FOR HOLOGRAPHIC RECORDING

BACKGROUND OF THE INVENTION

The present invention relates to a method and device for holographic recording, and more particularly, to a method and device for holographic recording which enable increased recording density by improving the selectivity along the Y direction defined with reference to the optical axes of a signal beam and reference beam.

DESCRIPTION OF THE PRIOR ART

Holographic recording is known as one method for realizing high-density information recording on a recording medium. In ordinary holographic recording, information is recorded by overlapping a signal beam and a reference beam on the holographic recording medium to write the interference fringes formed thereby. The information recorded in the recording medium can be reproduced by irradiating the recording medium with the reference beam. The reference beam projected onto the recording medium is diffracted by the diffraction grating formed by the interference fringes, thereby causing 2-dimensional information to appear as reproduced information. In such a recording medium, since all of the image information carried by the signal beam is reproduced at one time, high speed reproduction can be realized.

In order to increase recording capacity in holographic recording, 3-dimensional recording of interference fringes is commonly performed by positively utilizing the thickness direction of the recording medium.

By making the recording medium thicker, it is possible to enhance diffraction efficiency. And by multiplex recording, it is possible to further increase the recording capacity.

Various multiplexing methods are available, such as angular multiplexing, wavelength multiplexing, shift multiplexing, phase code multiplexing, peristrophic multiplexing and spatial multiplexing.

Shift multiplexing records holograms so as to partially overlap.

In shift multiplexing, the X direction is defined as the direction of a line of intersection between a plane including the optical axes of the signal beam and reference beam. (incidence plane) and the recording plane of the recording medium, and the Y direction is defined as the direction of a line lying normal to the incidence plane and intersecting the line of intersection. Since Bragg selectivity along the Y direction is low, it is difficult to improve degree of multiplexing along the Y direction in shift multiplexing.

In order to obtain the desired reproduced image (diffraction light) by reproduction of information recorded in the recording medium, it is necessary for the reproduction light parameters (angle, position, wavelength etc. of the incident light) to satisfy certain conditions called the "Bragg conditions."

When the range of the reproduction light parameters satisfying the Bragg conditions is narrow, the Bragg selectivity is said to be high, and in the opposite case, the Bragg selectivity is said to be low.

This led to the invention of Japanese Patent Application Laid Open No. 08-339157, which teaches combined use of shift multiplexing and aperture multiplexing. This invention improves selectivity along the Y direction and 2-dimensional multiplexing by providing a limiting aperture on the optical path of the reference beam to conduct filtering in Fourier space.

As mentioned above, in holographic shift multiplexing, the Bragg selectivity along the Y direction is low and selectivity along the Y direction is therefore improved utilizing aperture selectivity.

However, since this method changes the shape of the interference region by shaping the reference beam, there is a problem that the dynamic range of the holographic material is consumed more than necessary.

SUMMARY OF THE INVENTION

It is therefore an object of the present invention to provide a method and device for holographic recording which can increase recording density by improving the selectivity along the Y direction.

The above and other objects of the present invention can be accomplished by a holographic recording method for recording information as phase information of light by projecting a signal beam and a reference beam onto a recording medium, wherein an X direction is defined as the direction of a line of intersection between a plane including the optical axes of the signal beam and reference beam (incidence plane) and the recording plane of the recording medium, and the Y direction is defined as the direction of a line lying normal to the incidence plane and intersecting said line of intersection, comprising steps of using the reference beam modulated with a first phase code to record a first hologram at a predetermined position; and using the reference beam modulated with a second phase code whose pattern is different from that of the first phase code to record at a position shifted in the Y direction a second hologram that partially overlaps the first hologram.

According to the present invention, it is possible to improve selectivity along the Y direction, and therefore, to increase the recording density by improving the degree of multiplexing along the Y direction in shift multiplexing.

In a preferred aspect of the present invention, the holographic recording method further comprises a step of using the reference beam modulated with a third phase code whose pattern is different from that of the first and second phase codes to record at a position shifted in the Y direction a third hologram that partially overlaps the first and second holograms, a correlation between the third phase code and the second phase code being set lower than a correlation between the third phase code and the first phase code.

According to this aspect of the present invention, it is possible to further improve selectivity along the Y direction.

In a further preferred aspect of the present invention, the holographic recording method includes a step of using the reference beam modulated with the first phase code to record at position shifted to the X direction a fourth hologram that partially overlaps the first hologram.

According to this aspect of the present invention, it is possible to increase the recording density by improving the degree of multiplexing along the X and Y directions in shift multiplexing.

The above and other objects of the present invention can also be accomplished by a holographic recording method for recording information as phase information of light by projecting a signal beam and a reference beam onto a recording medium, wherein an X direction is defined as the direction of a line of intersection between a plane including the optical axes of the signal beam and reference beam (incidence plane) and the recording plane of the recording medium, and the Y direction is defined as the direction of a line lying normal to the incidence plane and intersecting said line of intersection, comprising a step of recording holograms by shift multiplexing at least in the Y direction and using phase code multiplexing in combination with the shift code multiplexing in the Y direction.

According to this aspect of the present invention, it is possible to further improve selectivity along the Y direction by using shift multiplexing and phase code multiplexing in combination.

In a preferred aspect of the present invention, the phase codes used in the phase code multiplexing have lower correlation with increasing overlap between two holograms recorded by shift multiplexing in the Y direction.

According to this aspect of the present invention, it is possible to further improve selectivity along the Y direction.

In a further preferred aspect of the present invention, orthogonal phase codes are used for holograms adjacent along the Y direction.

According to this aspect of the present invention, it is possible to further improve selectivity along the Y direction.

In a further preferred aspect of the present invention, the holograms are recorded along both the X direction and Y direction by shift multiplexing.

According to this aspect of the present invention, it is possible to further increase the recording density by improving degree of multiplexing along the X and Y directions in shift multiplexing.

In a further preferred aspect of the present invention, the same phase code is used for holograms recorded along the X direction.

According to this aspect of the present invention, it is possible to efficiently improve the degree of multiplexing of the phase code multiplexing with the least number of phase codes.

In a further preferred aspect of the present invention, two or more different phase codes are used for holograms recorded along the X direction.

According to this aspect of the present invention, it is possible also to realize phase code multiplexing along the X direction.

In a further preferred aspect of the present invention, the recording medium is a disk, and the X direction and Y direction are the tracking direction and the radial direction of the disk, respectively.

According to this aspect of the present invention, it is possible to improve selectivity in the radial direction of the disk by using phase code multiplexing in combination with shift multiplexing along the radial direction of the disk. It is therefore possible to increase the recording density by improving degree of multiplexing along the radial direction.

The above and other objects of the present invention can also be accomplished by a holographic recording device for recording information as phase information of light by projecting a signal beam and a reference beam onto a recording medium comprising: a laser beam source; a beam splitter for dividing the beam from the laser beam source; a spatial light modulator for generating a signal beam containing information by modulating the intensity of one divided beam; a phase spatial light modulator for generating a reference beam by modulating the phase of the other divided beam with a predetermined phase code; a controller for controlling the incidence position of the signal beam and reference beam on the recording medium; wherein an X direction is defined as the direction of a line of intersection between an incidence plane including the optical axes of the signal beam and reference beam and the recording plane of the recording medium, a Y direction is defined as the direction of a line perpendicular to the incidence plane, and the controller records holograms by shift multiplexing at least in the Y direction and using phase code multiplexing in combination with the shift multiplexing in the Y direction.

The above and other objects and features of the present invention will become apparent from the following description made with reference to the accompanying drawings.

BRIEF DESCRIPTION OF THE DRAWINGS

FIGS. 2(a) through (c) are schematic diagrams for explaining the relationship between the recording position of a hologram and the phase codes.

DESCRIPTION OF THE PREFERRED EMBODIMENTS

Figure 1:
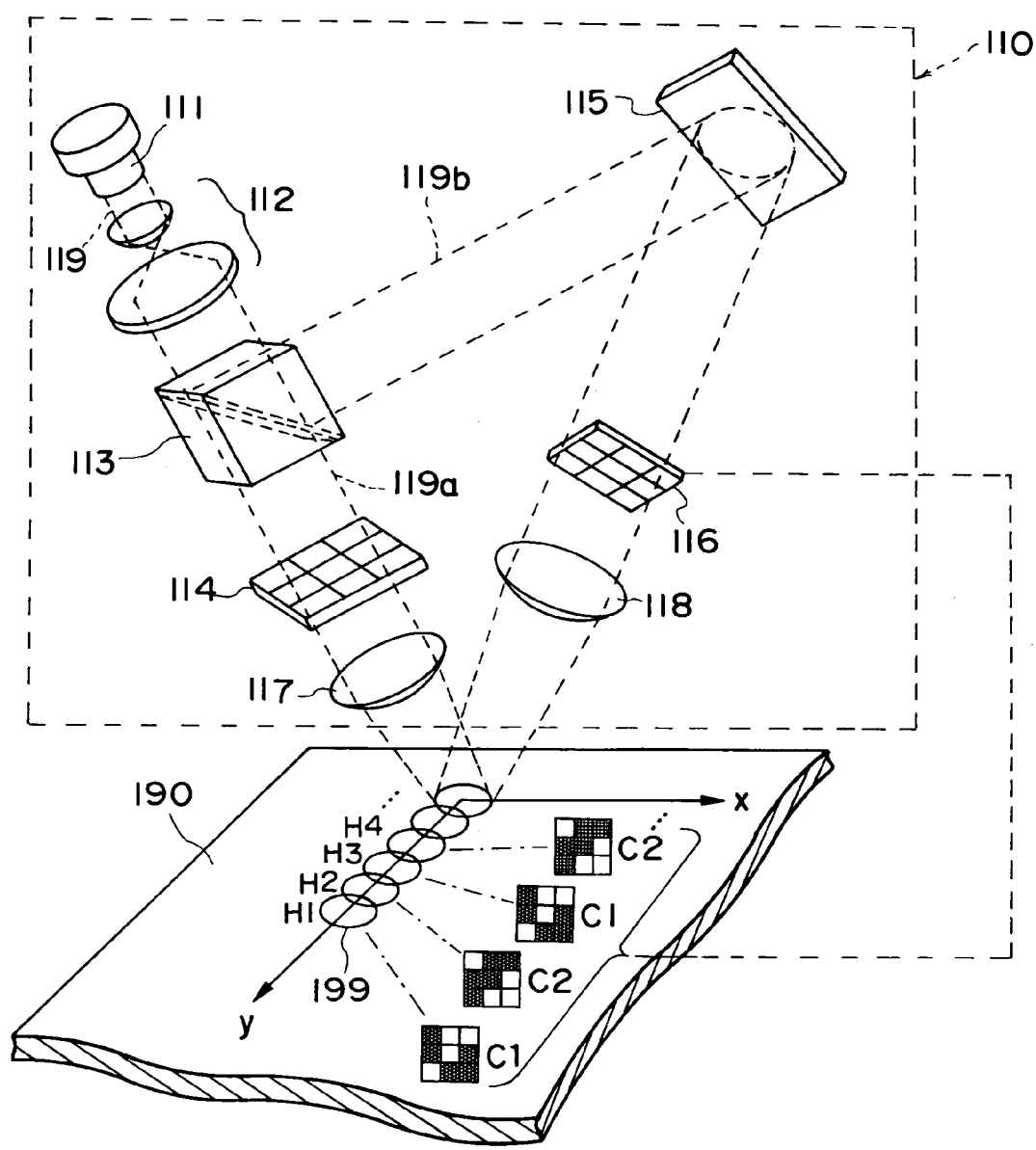
FIG. 1 is a schematic diagram showing the principle of the holographic recording of the present invention.

FIG. 1 is a schematic diagram showing the principle of the holographic recording of the present invention.

As shown in FIG. 1, in the holographic recording method of the present invention, holograms are recorded in a recording medium 190 with a holographic recording device 100. The holographic recording device 100 comprises at least an optical pickup 110 for generating beams projected onto the recording medium 190.

The optical pickup 110 comprises a laser beam source 111 used for recording and reproducing, a beam expander 112 for expanding the size of the beam 119 from the laser beam source 111, a beam splitter 113 for dividing the expanded beam 119 into two beams, a spatial light modulator (SLM) 114 for producing a signal beam carrying information by spatially modulating the intensity of one divided beam 119a, a mirror 115 for changing the optical path of the other divided beam 119b, a phase spatial light modulator (phase SLM) 116 for spatially modulating the phase of the beam 119b reflected at the mirror 115, and two Fourier transformation lenses 117 and 118.

A solid state laser, for example, is used as the laser beam source 111. It emits a linearly polarized coherent beam. The beam 119 emitted from the laser beam source 111 is expanded and collimated by the beam expander 112, after which it enters the beam splitter 113.

The beam 119a from the beam splitter 113 enters the SLM 114. The SLM 114 has a large number of pixels arranged in a matrix and spatially modulates the intensity of the beam 119a by selectively passing or blocking the beam at each pixel. A liquid crystal element, for example, is used as the SLM 114.

The beam 119b from the beam splitter 113 enters the phase SLM 116. The phase SLM 116 also has a large number of pixels arranged in a matrix and spatially modulates the phase of the beam by selecting the phase of the beam at each pixel. For example, selection between phase differences 0 (rad) or π (rad) relative a predetermined phase is made at each pixel. Thus, specific modulation patterns (phase codes) used for such modulation are supplied to the phase SLM 116 in accordance with prescribed conditions. A liquid crystal element, for example, is also used as the phase SLM 116.

The modulated beams 119a and 119b are simultaneously projected through the Fourier transformation lenses 117 and 118, respectively, onto the same position of the recording medium from different directions as the signal beam and the reference beam. This overlapping projection of the signal beam and reference beam forms interference fringes at the region of the beam spots and a hologram 199 carrying the information is therefore recorded.

The optical paths of the signal beam and reference beam projected onto the recording medium 190 are set to include the optical axes of the beams in an "incidence plane" lying perpendicular to the surface of the recording medium 190 and to make their incidence angles to the surface equal.

The X direction is defined as the direction of the line of intersection between the incidence plane and the recording plane of the recording medium, and the Y direction is defined as the direction of a line lying normal to the incidence plane that perpendicularly intersects said line of intersection. As illustrated in FIG. 1, the recording of holograms 199 progresses sequentially in the Y direction on the recording medium 190.

By shifting the position of the optical pickup 110 in the Y direction relative to the recording medium 190, the spots of the signal and reference beams are shifted in the Y direction sequentially, and the holographic recording therefore proceeds in the Y direction.

The recording in the Y direction is shift multiplexing and the shift amount to the next recording region is therefore set small so that at least adjacent holograms partially overlap.

Further, by using phase code multiplex recording in combination with the shift multiplexing, shortcomings of the shift multiplexing, such as that Bragg selectivity is low, are compensated. In the phase code multiplex recording, the correlation of the phase codes is set lower as the overlap of the holograms is higher, and an orthogonal phase code pattern is preferably used.

For example, shift multiplexing in which the degree of multiplexing of overlapping adjacent holograms is "2" is carried out as follows.

First, as shown in FIG. 1, a hologram H1 is recorded with a phase code C1. Next, the spots of the signal and reference beams are shifted in the Y direction and a hologram H2 is recorded with a second code C2 so as to partially overlap the first hologram H1. A pattern orthogonal to the first phase code C1 is used as the second phase code C2.

After recording the hologram H2, the spots of the signal and reference beams are shifted in the Y direction and a hologram H3 is recorded with the first code C1 so as to partially overlap the second hologram H2.

Thus, the shortcomings of the shift multiplexing, such as that Bragg selectivity is low, can be compensated and it is therefore possible to increase the recording density in the Y direction.

In the above embodiment, only two phase codes C1 and C2 are used alternately but three phase codes C1, C2 and C3 may be used by turns. Further, in shift multiplexing of degree of multiplexing "3, " in which the next adjacent hologram also overlaps, the shift amount in the Y direction is set smaller than in degree of multiplexing "2" multiplexing and a different code is supplied to each hologram. In this case, the correlation of the phase codes is preferably set lower as the overlap of the holograms is higher. For example, three phase codes C1, C2, and C3 are used by turns. Here, the phase codes C1 and C2, the phase codes C2 and C3, and the phase codes C3 and C1 are orthogonal.

FIGS. 2(*a*) through (*c*) are schematic diagrams for explaining the relationship between the recording position of the hologram and the phase code. FIGS. 2(*a*), (*b*), and (*c*) respectively show cases where shift multiplexing of 2, 3 and 4-multiplicity is performed in the Y direction.

As shown in FIG. 2(*a*), when holograms are recorded in the Y direction by 2-multiplicity shift multiplexing, a phase code which has a different pattern from that of the middle hologram H0 is used as the phase code for recording holograms H1 adjacent on opposite sides of the hologram H0.

The phase code pattern of the hologram H1 is preferably orthogonal to that of the hologram H0.

As shown in FIG. 2(*b*), when the holograms are recorded in the Y direction by 3-multiplicity shift multiplexing, a phase code which has a different pattern from that of the middle hologram H0 is used as the phase code for recording holograms H1 adjacent on opposite sides of hologram H0.

The phase code pattern of the hologram H1 is preferably orthogonal to that of the hologram H0.

Further, the phase code pattern of the hologram H2, which overlaps with the hologram H0 through the intervening hologram H1, that is, the next adjacent hologram H1, is preferably different from that of the hologram H0.

More preferably, the correlation of the phase codes is set lower as the overlap of the holograms is larger.

That is, the degree of the correlation of the phase code patterns of the holograms H1 and H2 relative to the hologram H0 is set so that H1<H2.

As shown in FIG. 2(*c*), when the holograms are recorded in the Y direction by the 4-multiplicity shift multiplexing, a phase code which has different pattern from that of the hologram H0 is used as the phase code for recording holograms H1 adjacent on both sides of central hologram H0.

The phase code pattern of the hologram H1 is preferably orthogonal to that of the hologram H0.

Further, the phase code pattern of the hologram H2, which overlaps the hologram H0 through the intervening hologram H1, that is, the next adjacent hologram H1, is preferably different from that of the hologram H0.

Furthermore, the phase code pattern of the hologram H3, which overlaps the hologram H0 through the intervening holograms H1 and H2, is preferably different from that of the hologram H0.

More preferably, the correlation of the phase codes is set lower as the overlap of the holograms is larger.

That is, the degree of the correlation of the phase code patterns of the hologram H1, H2 and H3 relative to the hologram H0 is set so that H1<H2<H3.

Figure 3:
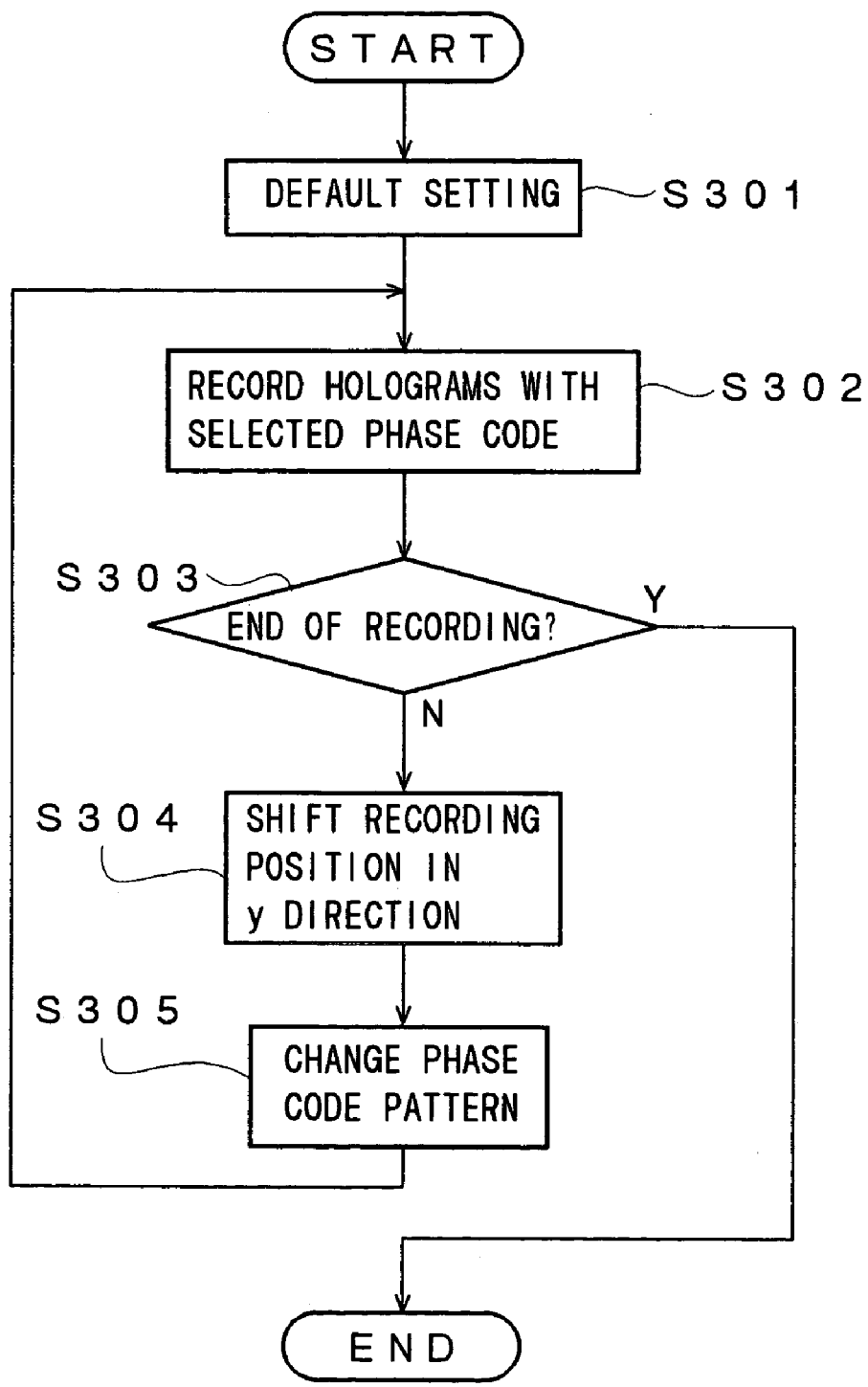
FIG. 3 is a flowchart showing the sequence of steps in the multiple recording.

FIG. 3 is a flowchart showing the sequence of steps in the foregoing multiplex recording.

As shown in FIG. 3, default settings are selected for a first recording position and a first phase code pattern (S301), after which a first hologram is recorded at the predetermined recording position with this phase code (S302). Next, if the recording has not been completed (S303N), the recording position is shifted in the Y direction (S304) and the phase code is changed to the next pattern (S305), after which a second hologram is recorded with this phase code (S302). By repeating the above steps, phase codes of first through nth patterns are used in order and thus the holograms are recorded in order (S302-S305). As mentioned above, the rotation of the phase codes is based on the degree of multiplexing of the phase shift multiplexing and the like. Since the pattern of the phase code changes at each recording of a hologram, the same phase code pattern is therefore never used at least at adjacent holograms. The holographic is finished when the information runs out (S303Y).

As described above, according to the present invention, it is therefore possible to improve selectivity along the Y direction by using phase code multiplex recording in combination with shift multiplexing in the Y direction. Consequently, it is possible to improve degree of multiplexing in the Y direction and increase recording density.

Figure 4:
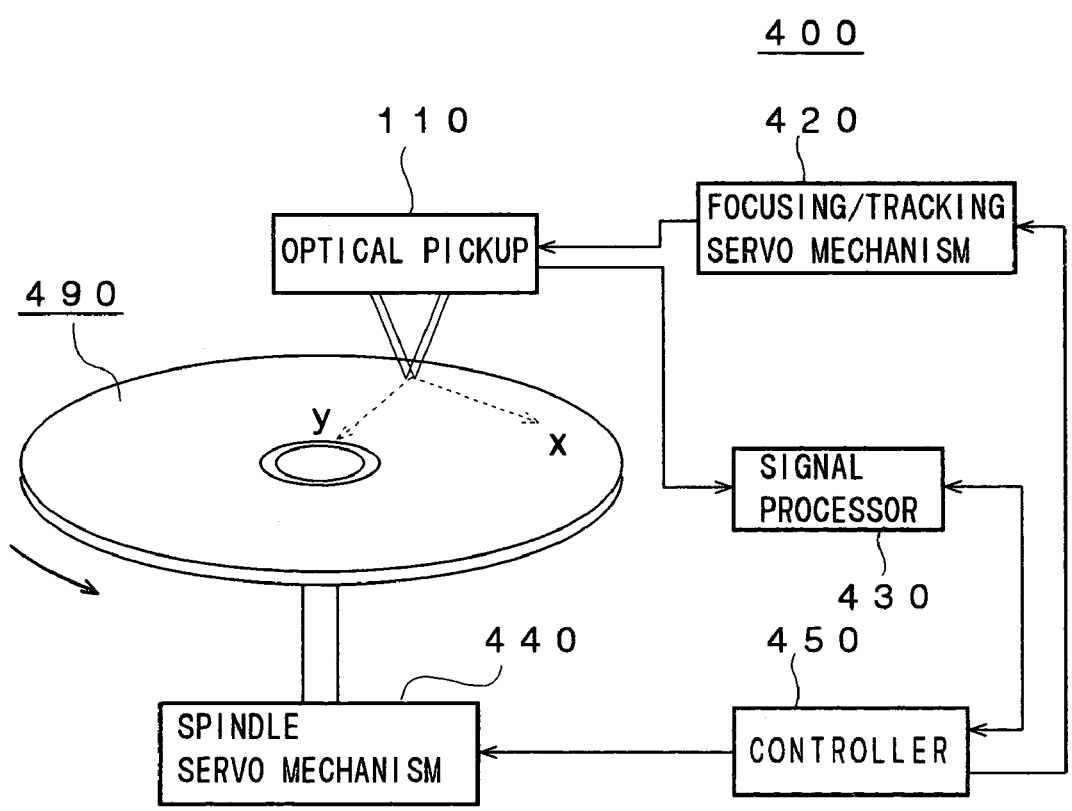
FIG. 4 is a schematic diagram showing the method of holographic recording in one preferred embodiment of the present invention.

FIG. 4 is a schematic diagram of the method of holographic recording in one preferred embodiment of the present invention.

As shown in FIG. 4, a disk-shaped holographic recording medium (disk) 490 is used in the holographic recording. Therefore, the holographic recording device 400 comprises an optical pickup 110 for generating beams projected onto the disk 490, a focusing and tracking servo mechanism 420 for controlling focusing and tracking of the optical pickup 420, a signal processor 430 for processing signals from the optical pickup 110, a spindle servo mechanism 440 for controlling rotation of the disk 490, and a controller 450 for controlling the different members.

The pickup 110 is arranged so that the track direction of the disk 490 is the X direction and the radial direction of the disk 490 is the Y direction. The spindle servo mechanism 440 rotates the disk 490.

Holograms are recorded sequentially in the track direction (the X direction) and are therefore recorded along a spiral from the inner circumference to the outer circumference, or from the outer circumference to the inner circumference.

Shift multiplexing in the track direction is realized by overlapping part of adjacent holograms along the Y direction, and shift multiplexing in the radial direction (the Y direction) is realized by overlapping part of adjacent holograms recorded in adjacent tracks.

Further, shift multiplexing in the radial direction is realized by setting the track pitch smaller and overlapping not only adjacent holograms recorded on the same track but also holograms recorded on adjacent tracks.

Moreover, if the track pitch is set still narrower, shift multiplexing is possible not only between the nearest adjacent tracks but also between these tracks and the next nearest track(s) therebeyond. The degree of multiplexing can therefore be set as desired.

As described above, shift multiplexing can be performed in the track direction and the radial direction, and the shift multiplexing and the phase code multiplex recording are used together in the radial direction. That is, phase code multiplex recording is performed with the same phase code pattern in the same track, and phase code multiplex recording is performed in the next track with a different phase code pattern from that used in the last track. Thus, phase code patterns overlapping each other in the radial direction are made different.

In the phase code multiplex recording, the correlation of the phase codes is set lower as the overlap of the holograms is higher, and an orthogonal phase code pattern is preferably used.

Figure 5:
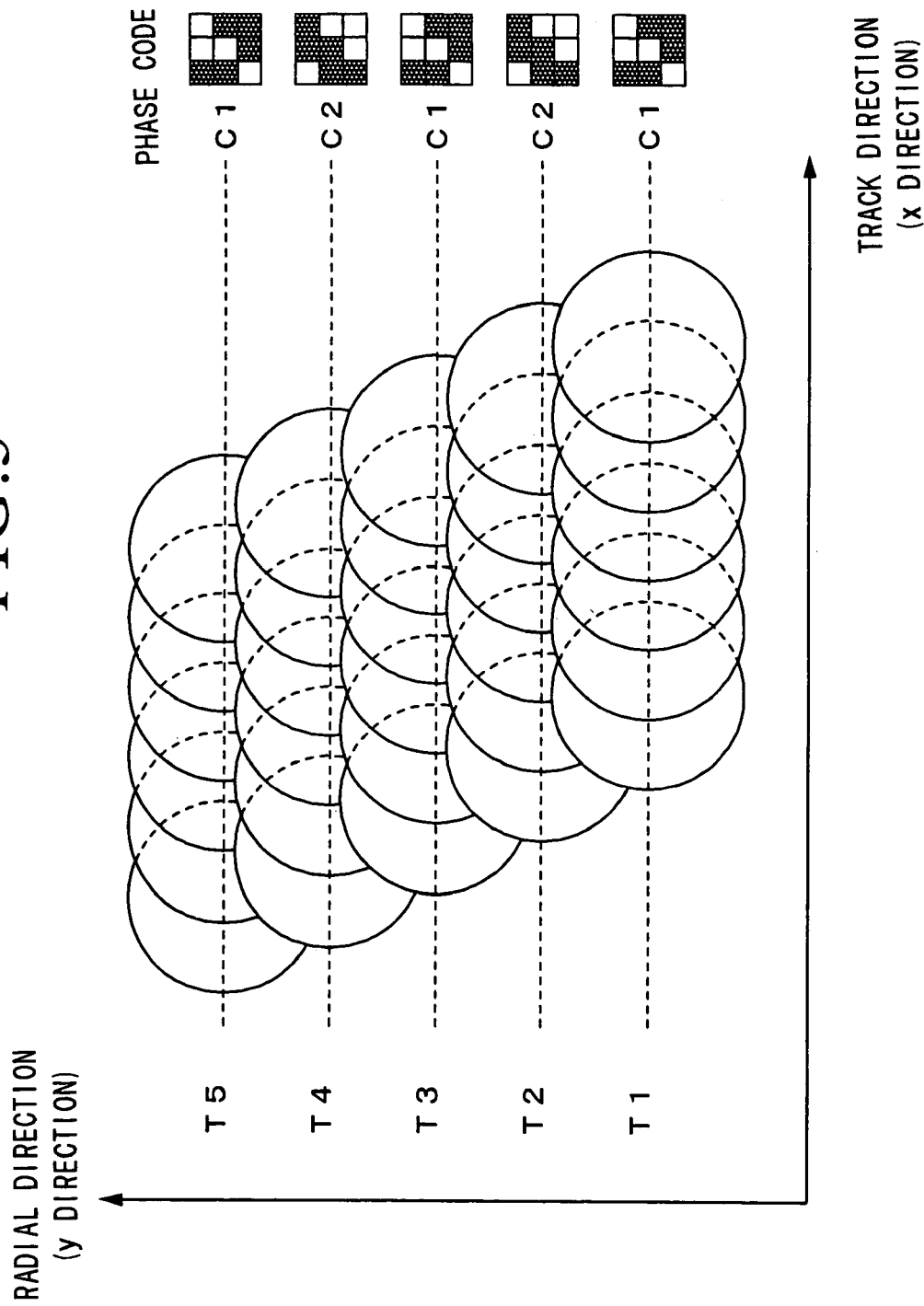
FIG. 5 is a schematic plan view showing an arrangement of holograms on a disk.

FIG. 5 is a schematic plan view showing an arrangement of the holograms on the disk.

As shown in the example of FIG. 5, when shift multiplexing is performed at 3-multiplicity in the track direction and 2-multiplicity in the radial direction, holograms are recorded sequentially by the shift multiplexing on first track T1 with a first phase code C1. The spots of the signal beam and the reference beam are shifted in the radial direction (the Y direction) and holograms are recorded sequentially on the next track T2 with a second phase code C2. A second phase code whose pattern is orthogonal to that of the first phase code is used. After recording holograms on the track T2, the spots of the signal beam and the reference beam are shifted in the Y direction and holograms are recorded sequentially on the next track T3 with first phase code C1 again.

Thus, the shortcomings of shift multiplexing, such as that Bragg selectivity is low in the radial direction, can be compensated and it is therefore possible to increase the recording density in the radial direction.

Holograms imparted with a phase code are also recorded in the track direction. However, since only one phase code pattern is used, the recording does not function substantially as phase code multiplex recording and only the shift multiplexing is realized.

In the multiplex recording in the track direction in which the Bragg selectivity is high, it is possible to increase recording density by such a shift multiplexing.

On the other hand, in the multiplex recording in the radial direction in which the Bragg selectivity is low, the shift multiplexing and the phase code multiplex recording are used together by changing the phase code pattern at every track. It is therefore possible to improve the degree of multiplexing of the shift multiplexing.

Figure 6:
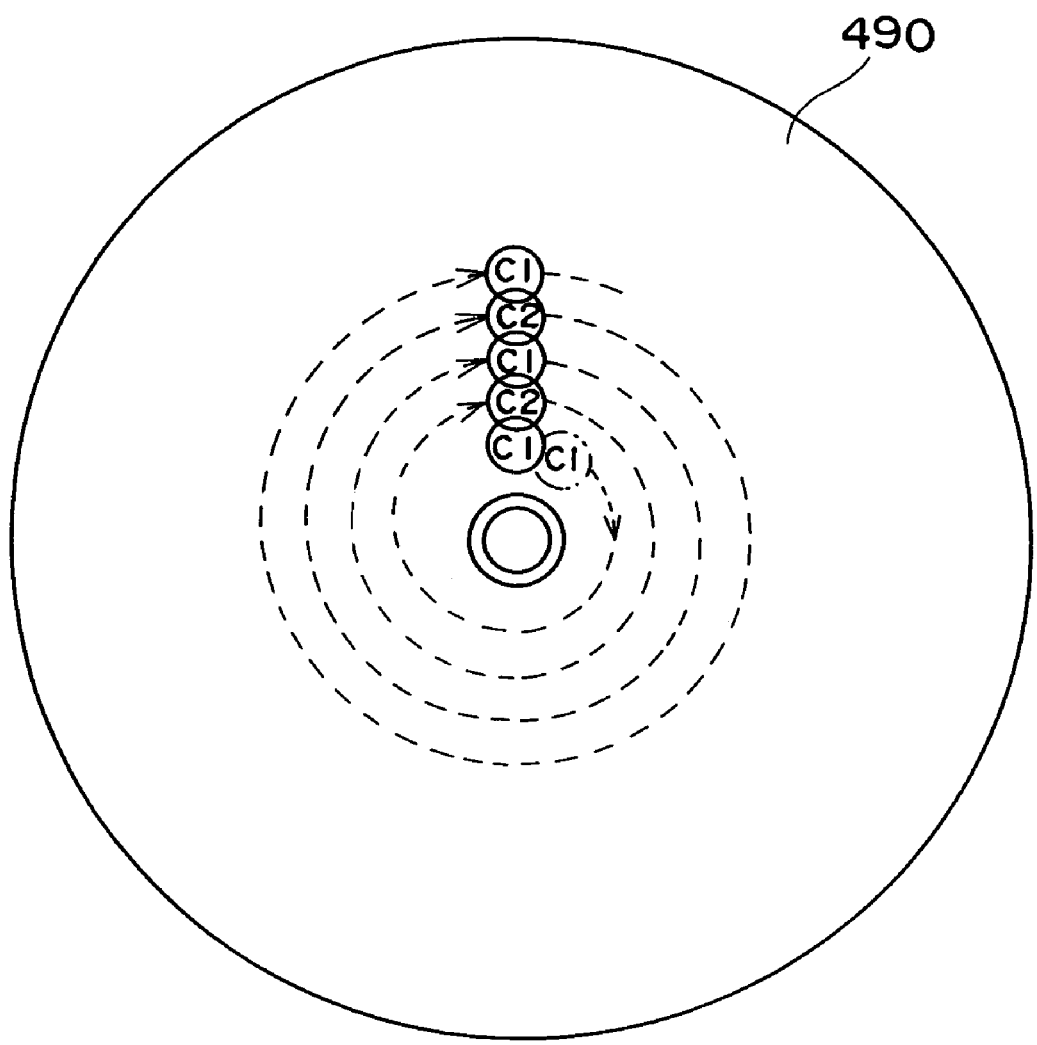
FIG. 6 is a schematic diagram showing an example of distribution of phase codes on the disk.

FIG. 6 is a schematic diagram showing an example of the distribution of phase codes on the disk.

As shown in FIG. 6, the holograms are recorded in a spiral pattern from the inner circumference to the outer circumference of the disk 490.

In the innermost first track, information is recorded with the phase code C1. In second track, information is recorded with the phase code C2 orthogonal to the phase code C1. In third track, information is recorded with the phase code C1 again. In subsequent tracks, holograms are recorded using phase codes C1 and C2 by turns.

Thus, the same phase codes are never used for holograms that overlap in the radial direction. Accordingly, it is possible to improve the degree of multiplexing of the shift multiplexing in the radial direction in which Bragg selectivity is low. If the track pitch is set narrower, it is possible to increase the recording density.

Figure 7:
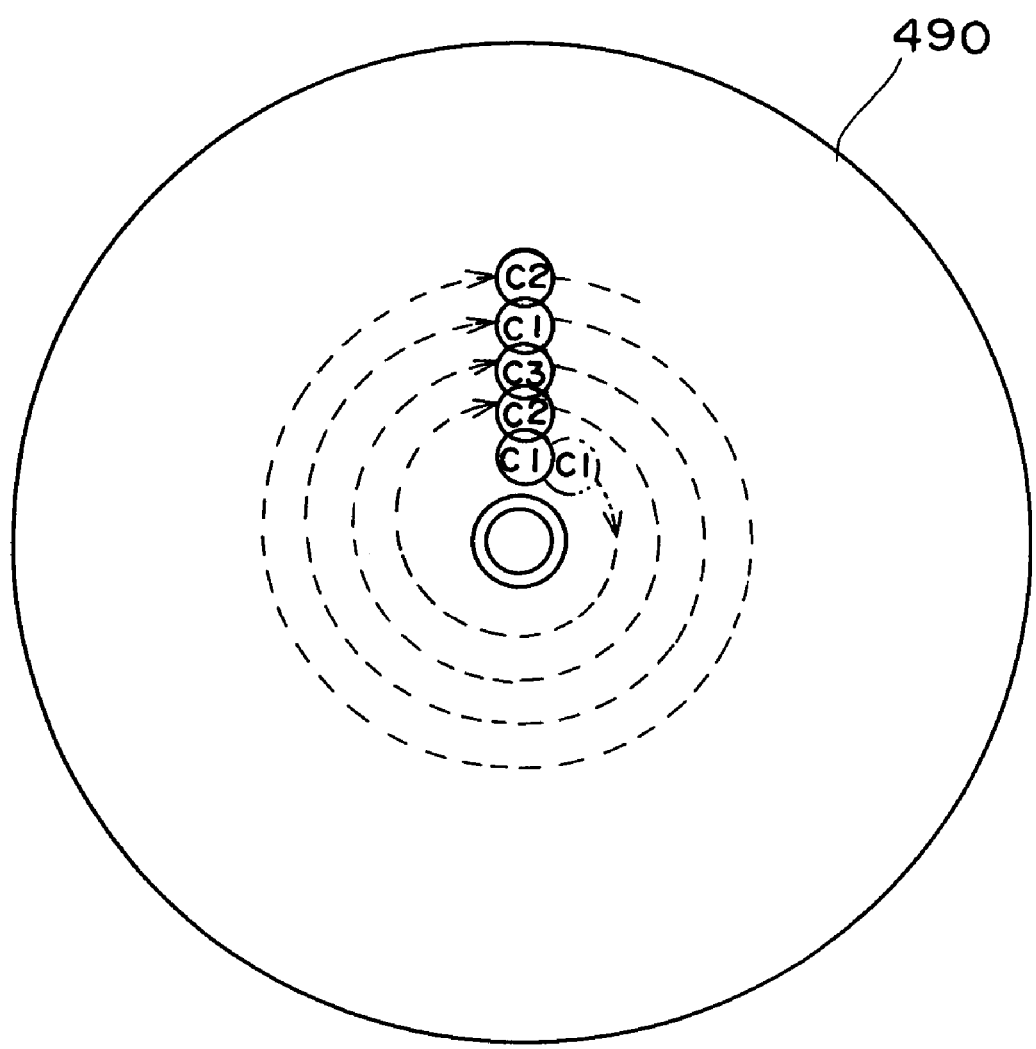
FIG. 7 is a schematic diagram showing another example of distribution of phase codes on the disk.

FIG. 7 is a schematic diagram showing another example of the distribution of phase codes on the disk.

As shown in FIG. 7, the holograms are recorded in a spiral pattern from the inner circumference to the outer circumference on the disk.

In the innermost first track, information is recorded with the phase code C1. In second track, information is recorded with the phase code C2 orthogonal to the phase code C1. In third track, information is recorded with the phase code C3 orthogonal to both phase codes C1 and C2. In subsequent tracks, holograms are recorded using the phase codes C1, C2 and C3 by turns.

Thus, here again, the same phase is never used for holograms that overlap in the radial direction. Accordingly, it is possible to improve the degree of multiplexing of the shift multiplexing in the radial direction in which Bragg selectivity is low. If the track pitch is set narrower, it is possible to increase the recording density.

Figure 8:
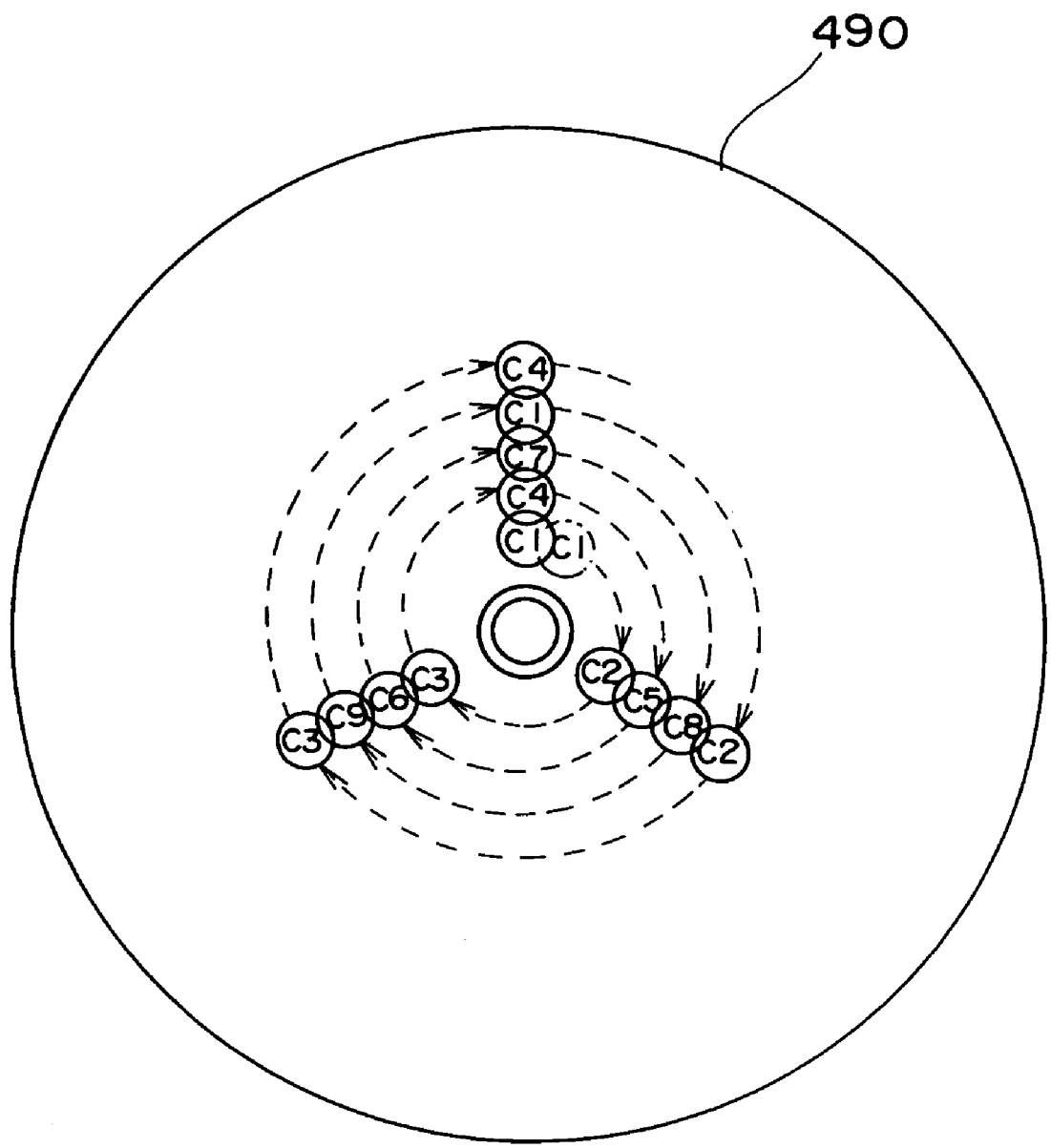
FIG. 8 is a schematic diagram showing another example of distribution of phase codes on the disk.

FIG. 8 is a schematic diagram showing another example of the distribution of phase codes on the disk.

As shown in FIG. 8, holograms are recorded in a spiral pattern from the inner circumference to the outer circumference of the disk 490. However, a number of phase code patterns are used in the same track.

In the innermost first track, information is recorded with the phase codes C1, C2 and C3. In second track, information is recorded with the phase codes C4, C5 and C6. In third track, information is recorded with the phase codes C7, C8 and C9. In subsequent tracks, holograms are recorded by repeating the foregoing.

Thus, here again, the same phase code is never used for holograms that overlap in the radial direction. Accordingly, it is possible to improve degree of multiplexing of the shift multiplexing in the radial direction in which Bragg selectivity is low. If the track pitch is set narrower, it is possible to increase the recording density.

Moreover, the recording method is not limited to that of changing the phase code at every track and it is possible instead to change the code each time a prescribed number of holograms is recorded or each time holograms are recorded a prescribed number of times.

Figure 9:
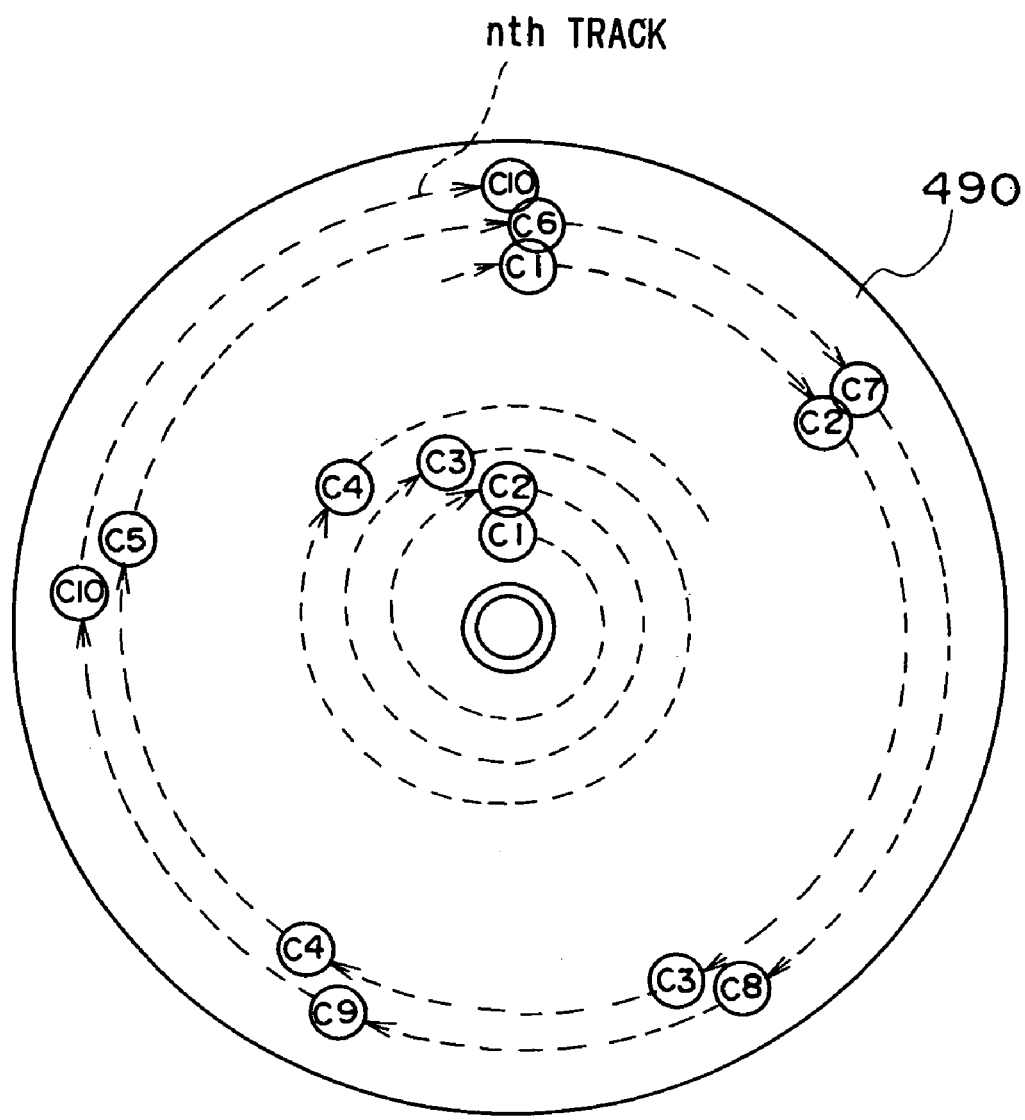
FIG. 9 is a schematic diagram showing another example of distribution of phase codes on the disk.

FIG. 9 is a schematic diagram showing another example of the distribution of phase codes on the disk.

As shown in FIG. 9, the holograms are recorded in a spiral pattern from the inner circumference to the outer circumference of the disk 490.

When the shift multiplexing is performed at a predetermined degree of multiplexing, for example, multiplex recording of holograms is conducted using phase codes C1-C10 of ten patterns with respect to a disk in which the number of holograms recordable at the outermost nth track is 5 fold the number of holograms recordable at the innermost first track.

The maximum recording number (k) of holograms at the first track located at the inner circumference is defined as the limit for changing the phase code, and the phase is changed to the next in order each time recording of (k) number of holograms is completed.

Thus, information is recorded in the first track with the phase code C1. Information is recorded in the second track with the phase code C2. Information is then recorded from near the end of the second track to the third track with the phase code C3, and recorded from near the end of the third track to the fourth track with the phase code C4. Such sequential recording of information is continued until, for example, holograms are recorded in the (n−1)th track with the phase codes C1-C5 and in the nth track with the phase codes C6-C10.

Accordingly, it is possible to improve the degree of multiplexing of the shift multiplexing in the radial direction in which Bragg selectivity is low. If the track pitch is set narrower, it is possible to increase the recording density.

As described above, even if the phase code changes each time a predetermined number of the holograms are recorded, the holograms are recorded with the several phase codes having patterns orthogonal to each other in order. Thus it is possible to improve the degree of multiplexing of the shift multiplexing in the radial direction in which Bragg selectivity is low. If the track pitch is set narrower, it is possible to increase the recording density.

Figure 10:
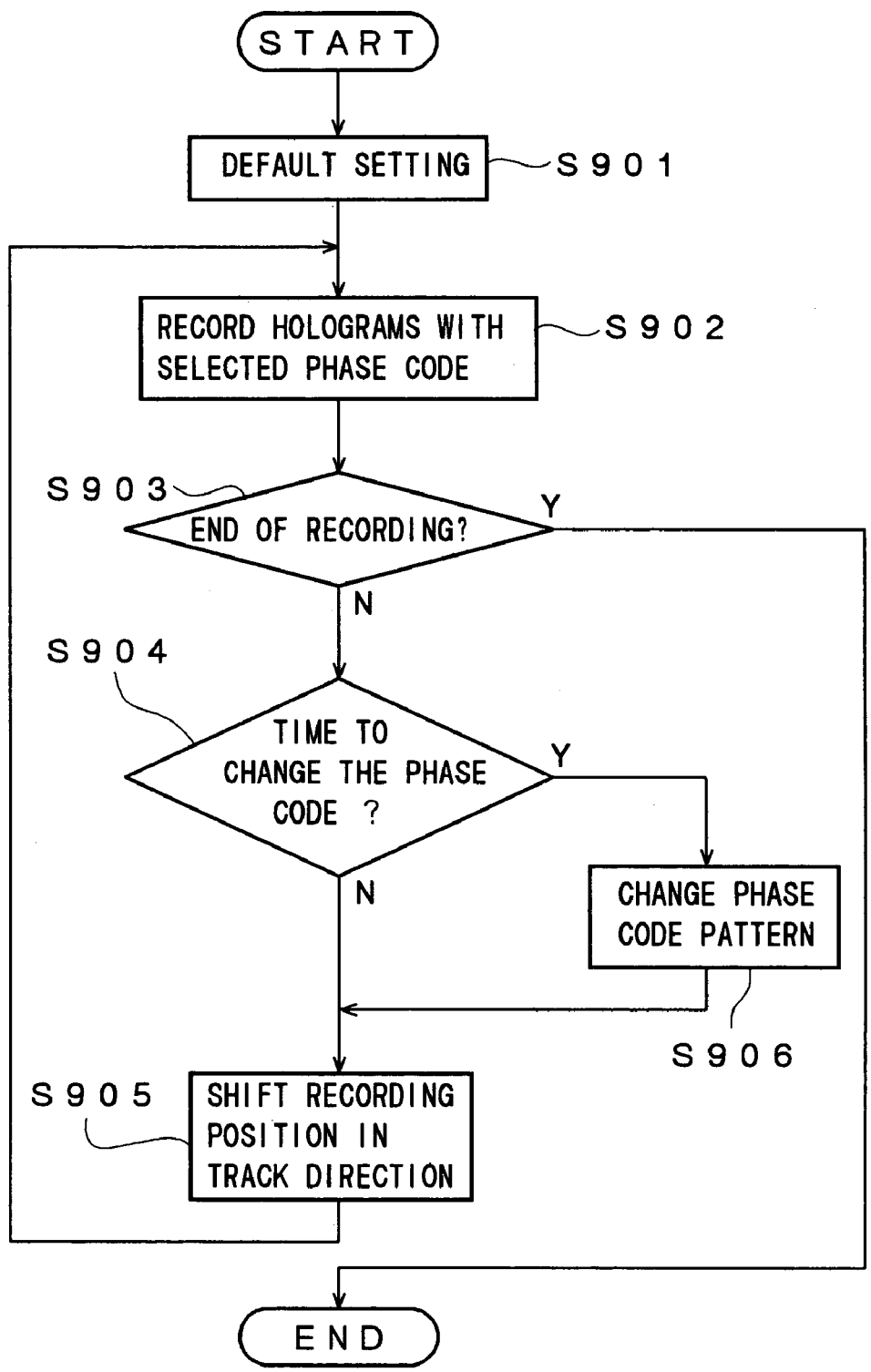
FIG. 10 is a flowchart showing the sequence steps in multiplex recording on the disk.

FIG. 10 is a flowchart showing the sequence of steps in multiplex recording on the above disk.

As shown in FIG. 10, default settings are selected for a predetermined recording position and first pattern of the phase code (S901), after which a first hologram is recorded at the recording position with this phase code (S902).

Next, if the recording has not been completed (S903N), the recording position is shifted in the track direction (S904N, S905), after which a second hologram is recorded with a phase code of the same pattern as that of used for the immediately preceding hologram (S902).

By repeating the above steps, holograms are sequentially recorded (S902-S905) and the phase code is changed to the next pattern at the predetermined time point for changing the phase code (S904Y, S906).

The predetermined time point is the time point at which a predetermined number of the holograms has been recorded, the time point at which holograms have been recorded a predetermined number of times, or the time point at which the recording of holograms in a track has been completed. In this way, holograms are recorded by repeatedly using several phase code patterns by turns. When no further information to be recorded exists, the holographic recording is terminated (S903).

As described above, according to the present invention, it is possible to improve selectivity along the radial direction (the Y direction) by using the phase code multiplex recording in combination with the shift multiplexing in the radial direction. It is therefore possible to improve the degree of multiplexing in the radial direction and to increase the recording density.

Figure 11:
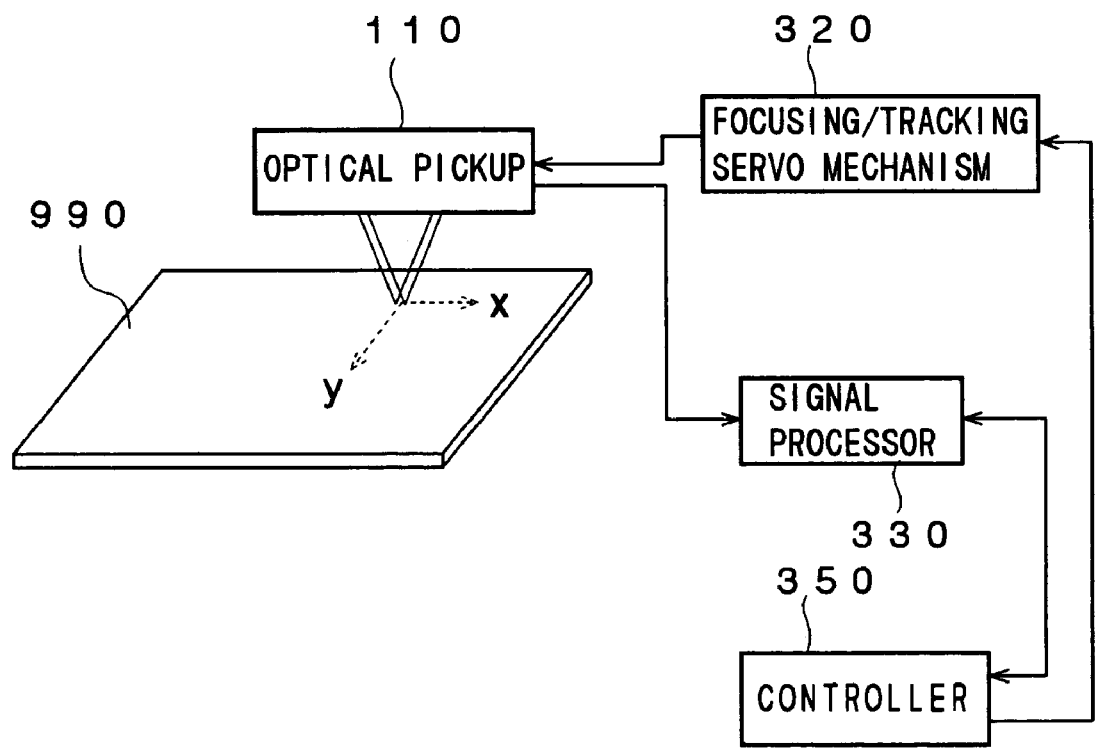
FIG. 11 is a schematic diagram showing holographic recording in another preferred embodiment of the present invention.

FIG. 11 is a schematic diagram showing the holographic recording in accordance with another preferred embodiment of the present invention. Components that are the same as those shown in FIG. 1 are assigned the same reference symbols and explanation thereof will be omitted.

As shown in FIG. 11, the recording medium 990 used in this embodiment is of card type. A holographic recording device 900 comprises an optical pickup 110, a focusing and tracking servo mechanism 320, a signal processor 330 and a controller 350.

The optical pickup 110 is set up so that the track direction, i.e., the longitudinal direction of the card type recording medium 990, is, set in the X direction and the width direction orthogonal to the longitudinal direction is set in the Y direction. Then the optical pickup 110 is driven in the X and Y direction by the focusing and tracking servo mechanism 320. Thus holograms are two-dimensionally recorded in the X and Y directions.

At this time, shift multiplexing in the track direction (the X direction) is realized by partially overlapping adjacent holograms in the track direction, and shift multiplexing in the width direction (the Y direction) is realized by partially overlapping at least adjacent holograms in the width direction. The degree of multiplexing of the holographic recording can be arbitrarily set.

As described above, shift multiplexing can be performed in the track direction and the width direction and the shift multiplexing and the phase code multiplex recording are used together in the width direction. That is, the phase code multiplex recording is performed with same phase code pattern in same track, and in the next track, the phase code multiplex recording is performed with a different phase code pattern from that used in last track. Thus, the phase code patterns overlapping each other in the radial direction are made different.

In the phase code multiplex recording, the correlation of the phase codes is set lower as the overlap of the holograms is higher, and an orthogonal phase code pattern is preferably used.

As described above, according to the present invention, it is possible to improve selectivity in the width direction (the Y direction) by using phase code multiplex recording in combination with the shift multiplexing in the radial direction. It is therefore possible to improve the degree of multiplexing in the width direction and to increase the recording density.

The present invention has thus been shown and described with reference to specific embodiments. However, it should be noted that the present invention is in no way limited to the details of the described arrangements but changes and modifications may be made without departing from the scope of the appended claims.

For example, the above embodiments were explained with respect to disc-type and card-type recording media. However, the recording medium is not particularly limited and any of various types of recording media can be selected.

As described above, according to the present invention, it is possible to provide a method and device for holographic recording which can increase recording density by improving selectivity in the Y direction defined with reference to the optical axes of the signal and reference beams.

The invention claimed is:

1. A holographic recording method for recording information as phase information of light by projecting a signal beam and a reference beam onto a recording medium, wherein an X direction is defined as the direction of a line of intersection between a plane including the optical axes of the signal beam and reference beam (incidence plane) and the recording plane of the recording medium, and the Y direction is defined as the direction of a line lying normal to the incidence plane and intersecting said line of intersection, comprising the steps of:
   using the reference beam modulated with a first phase code to record a first hologram at a predetermined position;
   using the reference beam modulated with a second phase code whose pattern is different from that of the first phase code to record at a position shifted in the Y direction a second hologram that partially overlaps the first hologram; and
   using the reference beam modulated with a third phase code whose pattern is different from that of first and second phase codes to record at a position shift in the Y direction a third hologram that partially overlaps the first and second holograms wherein a correlation between the third phase code and the second phase code is set lower than a correlation between the third phase code and the first phase code.

2. holographic recording method in accordance with claim 1 including a step of using the reference beam modulated with the first phase code to record at a position shifted to the X direction a fourth hologram that partially overlaps the first hologram.

3. The holographic recording method in accordance with claim 1, wherein phase codes having lower correlation with the first phase code are employed as the second phase code as overlap between the first hologram and the second hologram increases.

4. The holographic recording method in accordance with claim 1, wherein orthogonal phase codes are used for the first hologram and the second hologram adjacent along the Y direction.

5. The holographic recording method in accordance with claim 2, wherein orthogonal phase codes are used for the first hologram and the second hologram adjacent along the Y direction.

6. The holographic recording method in accordance with claim 3, wherein orthogonal phase codes are used for the first hologram and the second hologram adjacent along the Y direction.

7. The holographic recording method in accordance with claim 2, wherein two or more different phase codes are used for the first hologram and the fourth hologram recorded along the X direction.

8. The holographic recording method in accordance with claim 3, wherein two or more different phase codes are used for the first hologram and a fourth hologram recorded along the X direction.

9. The holographic recording device for recording information as phase information of light by projecting a signal beam and a reference beam onto a recording medium comprising:
   a laser beam source;
   a beam splitter for dividing the beam from the laser beam source;
   a spatial light modulator for generating the signal beam containing information by modulating the intensity of one divided beam;
   a phase spatial light modulator for generating the reference beam by modulating the phase of the other divided beam with a predetermined phase code; and
   a controller for controlling the incidence position of the signal beam and reference beam on the recording medium wherein,
   an X direction is defined as the direction of a line of intersection between an incidence plane including the optical axes of the signal beam and reference beam and the recording plane of the recording medium,
   a Y direction is defined as the direction of a line perpendicular to the incidence plane,
   and the controller is adapted to use the reference beam modulated with a first phase code to record a first hologram at a predetermined position,
   use the reference beam modulate with a second phase code having a pattern different from a pattern of the first phase code to record at a position shifted in the Y direction a second hologram that partially overlaps the first hologram, and
   use the reference beam modulated with a third phase code having a pattern different from that of the first and second phase codes to record at a position shifted in the Y direction a third hologram that partially overlaps the first and second holograms wherein a correlation between the third phase code and the second phase code is set lower than a correlation between the third code and the first phase code.

10. The holographic recording method comprising:
   projecting a signal beam and a reference beam onto a recording medium;
   modulating the reference beam with a first phase code to generate a first hologram;
   recording the first hologram at a first position;
   modulating the reference beam with a second phase code having a pattern different than a pattern of the first phase code to generate a second hologram;

recording the second hologram at a second position shifted in a radial direction relative to the first position so that the second hologram partially overlaps the first hologram;

modulating the reference beam with a third phase code having a pattern different from the patterns of the first and second phase codes to generate a third hologram; and recording the third hologram at a third position shifted in a radial direction relative to the first and second positions so that the third hologram partially overlaps the first and second holograms wherein a correlation between the third phase code and the second phase code is set lower than a correlation between the third phase code and the first phase code.

11. The holographic recording method of claim 10, further comprising:

shifting a fourth hologram in a track direction to partially overlap the first hologram.

12. The holographic recording method of claim 5 wherein two or more different phase codes are used for the first hologram and the fourth hologram recorded along the X direction.

* * * * *

UNITED STATES PATENT AND TRADEMARK OFFICE
CERTIFICATE OF CORRECTION

PATENT NO. : 7,362,687 B2  Page 1 of 1
APPLICATION NO. : 10/759452
DATED : April 22, 2008
INVENTOR(S) : Takuya Tsukagoshi It is certified that error appears in the above-identified patent and that said Letters Patent is hereby corrected as shown below:

Column 11
Line 58, "holographic recording method in accordance with;" should read as -- The holographic recording method in accordance with --.

Signed and Sealed this

Fifth Day of May, 2009

JOHN DOLL
*Acting Director of the United States Patent and Trademark Office*